United States Patent [19]

Chi et al.

[11] Patent Number: 4,496,854
[45] Date of Patent: Jan. 29, 1985

[54] ON-CHIP SQUID CASCADE

[75] Inventors: Cheng-Chung J. Chi; Arthur Davidson, both of Yorktown Heights; Chang-Chyi Tsuei, Chappaqua, all of N.Y.

[73] Assignee: International Business Machines Corporation, Armonk, N.Y.

[21] Appl. No.: 362,581

[22] Filed: Mar. 29, 1982

[51] Int. Cl.$^3$ .................... H03K 3/38; H03K 17/92
[52] U.S. Cl. .................................... 307/306; 357/5
[58] Field of Search ............. 307/306; 357/5; 330/60, 330/62; 365/162

[56] References Cited

U.S. PATENT DOCUMENTS 4,051,393  9/1977  Fulton ............................... 307/306
4,280,095  7/1981  Hinton ................................. 357/5

OTHER PUBLICATIONS

W. Baechtold et al., "Nonlatching Logic Circuit Using Josephson Junctions," IBM Technical Disclosure Bulletin, vol. 18, No. 12, May 1976, p. 4167.
T. R. Cheewala et al., "Josephson Long-Line Receiver," IBM Technical Disclosure Bulletin, vol. 24, No. 1A, Jun. 1981, p. 260.
IEEE Transactions on Magnetics, vol. MAG 17, No. 1, Jan. 19, 1981, pp. 395–399, R. F. Voss et al., "Ultra Low Noise Nb DC SQUIDS".
M. B. Ketchen et al., "Low Frequency Noise in Small-Area Tunnel Junction SQUIDS" Proceedings of the Second International Conf. of Superconducting Quantum Devices, May 6–9, 1980, pp. 227–236.
J. M. Jaycox et al., "Planar Coupling Scheme for Ultra Low Noise DC SQUIDS" IEEE Transactions on Magnetics, vol. MAG 17, No. 1, Jan. 1981, pp. 400–403.

Primary Examiner—John Zazworsky
Attorney, Agent, or Firm—Jackson E. Stanland; Carl C. Kling

[57] ABSTRACT

A superconducting circuit including at least two DC SQUID stages integrated on the same superconducting chip and coupled by a circuit providing efficient transfer of current from the first SQUID stage to the second SQUID stage with large bandwidth. Each SQUID stage is comprised of a superconducting loop having at least two Josephson devices therein, there being shunt resistors across the Josephson devices to render them nonhysteretic. The coupling means between stages is directly connected to the shunt resistors of the first stage and includes a transmission line and an impedance circuit for matching the impedance of the transmission line, where the impedance circuit provides a real impedance over a large frequency range up to approximately the frequency of Josephson oscillation of the Josephson devices in DC SQUID. Feedback from the second SQUID stage to the first SQUID stage improves the input dynamic range and linearity of the circuit.

17 Claims, 13 Drawing Figures

FIG. 1.1
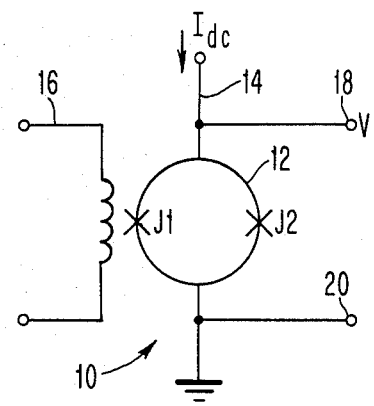
FIG. 1.2
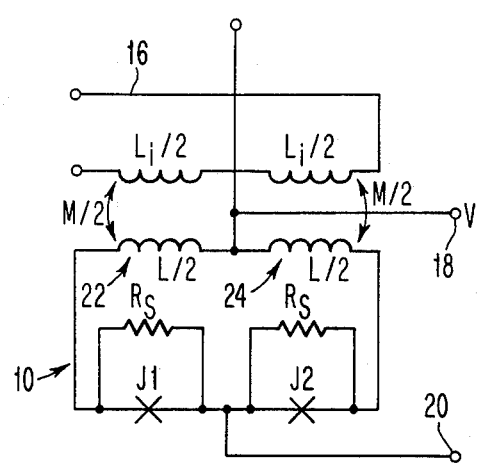
FIG. 2
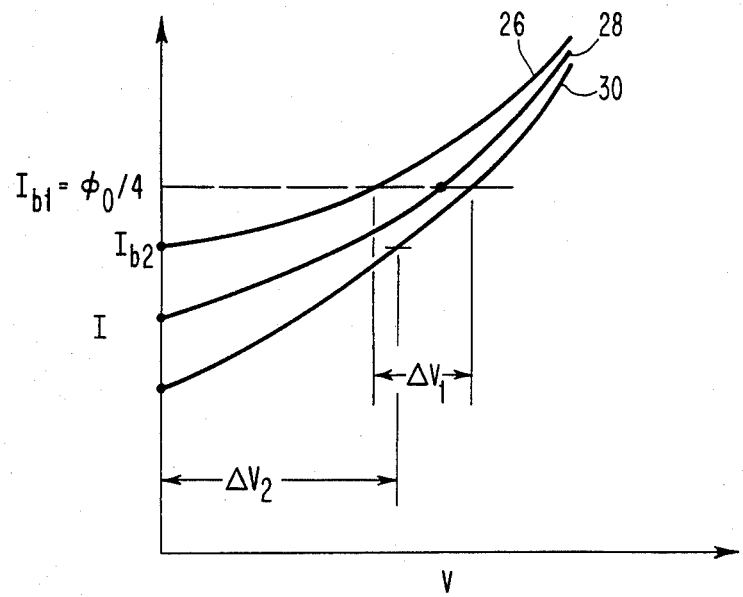

ON-CHIP SQUID CASCADE

TECHNICAL FIELD

This invention relates to superconducting quantum interference devices (SQUID's), and more particularly to a fully integrated, on-chip cascade of two or more DC SQUID's.

BACKGROUND ART

Both RF and DC SQUID's are known in the art, and have been proposed for use in volt meters, current meters, magnetometers, and amplifiers. These are very low intrinsic noise devices which have ultrahigh intrinsic sensitivity to magnetic fields. In particular, DC SQUID's have intrinsic energy sensitivities on the order of Planck's constant and show promise for providing very sensitive instruments.

A DC SQUID is a superconducting electronic device that is operated in a cryogenic environment. In its basic form, a SQUID acts as a two terminal element with a nonlinear current-voltage relationship. The exact current-voltage correspondence is dependent on the magnetic field applied to the device. Most of the applications for SQUID's make use of this magnetic flux dependence in order to read out signals. For example, reading out the voltage fluctuations in a current-biased, unshielded SQUID provides a method for detecting changes in the local magnetic field. In the usual device, a coil is placed near a current-biased SQUID so that a signal may be introduced as a current in the coil. The magnetic field generated by the current couples to the SQUID, influencing the voltage across it.

While an RF SQUID relies on RF frequency modulation to operate, a DC SQUID uses DC bias. The basis of any Josephson technology SQUID is a superconducting loop interrupted by one or more Josephson devices. In a particular case, the Josephson device can be a Josephson junction, a weak link, or a point contact junction. All of these have advantages and disadvantages, but the most suitable for the present invention is the Josephson tunnel junction. This junction is formed from a thin tunnel barrier (generally an insulating material) located at the interface of two superconducting electrodes. The tunnel barrier is sufficiently thin that Josephson currents can tunnel through it, and is typically 50 Å. As is well known, the resistanceless Josephson current is a sinusoidal function of the phase difference of the electron wave function across the junction:

$$I = I_0 \sin \delta,$$

where $I_0$ is the critical current of the junction and $\delta$ is the phase difference. The time rate of change of the phase is proportional to the voltage drop across the junction:

$$\frac{d\delta}{dt} = (2e)\frac{2\pi}{h} V,$$

where e is the electron charge, h is Planck's constant and V is the voltage drop across the junction. At currents less than the critical current $I_0$ the junction exhibits zero resistance in the limit of low frequency, while at currents greater than $I_0$ the phase difference continually increases, resulting in high frequency oscillations in the junction voltage. Unshunted junctions commonly show hysteresis. That is, if the junction current is increased to exceed the critical current, then the junction switches into the voltage state, and the current must be reduced to well below the critical current before the junction will switch back into the superconducting state. By shunting the junction with a small enough resistance, transitions between the superconducting and normal states may be accomplished in a nonhysteretic manner. This is known in the art, the condition for nonhysteretic behavior being that the parameter $\beta_c$ be less than unity, where:

$$\beta_c = \frac{2\pi I_0 R^2 C}{\phi_0},$$

where $I_0$, R, and C are the junction critical current, shunt resistance, and capacitance. The single flux quantum $\phi_0$ is given by $$\phi_0 = \frac{h}{2e},$$

where e is the electronic charge and h is Planck's constant.

The state of the art in DC SQUID's is described in an article by M. B. Ketchen, which appeared in IEEE Trans. on Magnetics, Vol. MAG. 17, No. 1, January 1981, at page 387. Since these devices are well known, the following will be only a brief description of a DC SQUID. In it simplest form, two resistively shunted junctions are placed in a superconducting loop, and a bias current is introduced in such a way as to divide between the two junctions. Since the loop is superconducting, the current flowing around it can be described in terms of an electron wave function possessing both magnitude and phase. The Josephson equations relate the phase of the electron wave function across the junctions to the junction voltages. Single-valued-ness of the wave function requires that the phase difference around the SQUID loop be an integer times $2\pi$. Consequently, the oscillations in the phases of the two junctions of the DC SQUID are "coupled" by the superconducting loop. At all times, the phase is a well defined parameter which enables one to predict interference effects in multi-junction devices. If the phase around the loop is altered externally, such as by coupling a magnetic field into the superconducting loop, the critical current of the SQUID can be modulated. These modulations exhibit a period of $\phi_0$ ($2.07 \times 10^{-15}$ webers) in the flux applied through the SQUID loop. The magnitude of the critical current modulations is a function of $\beta = 2LI_0/\phi_0$, where L is the inductance of the loop. If the SQUID is biased at a constant current above the minimum critical current, a changing magnetic flux coupled into the loop can be detected by observing a modulation of the SQUID voltage. That is, the applied magnetic flux changes $I_0$, causing the SQUID to switch to its voltage state then back to its superconducting state, etc. (shunted junctions are nonhysteretic). SQUID's are evaluated based on several parameters, including noise, the efficiency of the interface between the input coil and the SQUID (gaged by the coupling constant), and a figure of merit called the "energy sensitivity referred to the input coil". These terms are well known in the art, and are considered by designers using SQUID devices in geophysical, biomedical, and scientific applications. While the single SQUID circuit is suitable for many applications, such circuits will not provide extremely high bandwidth for use in very high frequency applications. For example, in the area of far infrared detection, an IF amplifier is required having a bandwidth of approximately 1 GHz. Conventional SQUID circuits cannot provide this bandwidth while having high sensitivity. If a SQUID IF amplifier could be provided, it would be a key component for a fully integrated millimeter wave receiver, such as a heterodyne receiver comprised of a tunnel junction array as a mixer, another array or high Q SQUID as a local oscillator, and a SQUID IF amplifier. Such a receiver would be the lowest noise receiver available at wave lengths of about 1 millimeter, and would be invaluable for detection of interstellar organic molecules and other astronomy uses.

In order to provide a high gain SQUID amplifier which has high bandwidth and sensitivity, it is proposed to cascade DC SQUID's on the same superconducting chip. In particular, a technique for coupling energy out of a SQUID stage is described, where essentially all of the current in any SQUID stage is transferred to the input of the next SQUID stage. Such a technique means that dependence on room temperature electronics is minimized and an entire cryogenic amplifier can be provided.

While cascading of amplifier stages can lead to circuit advantages, especially for high frequency, high bandwidth applications, the difficulty in providing a cascade is in effectively transferring current from one stage to the next without altering the desired current-voltage characteristics of individual SQUID stages. Generally, a substantial amount of bias current passes through the shunt resistors in the SQUID stages, and is lost. In the present invention, essentially all of the current which passes through the shunt resistors is transferred to the next stage of the amplifier, providing high sensitivity and gain. Further, there is no need for room temperature electronics to process the signals from one stage of the amplifier, prior to their use as the input to the next stage. A circuit for properly matching impedance and for keeping the impedance real to the highest frequency of the SQUID is used to effectively couple power from one SQUID stage to the next. Even though this circuit contains resistance, the bandwidth of the amplifier is not adversely affected. This is accomplished by an impedance matching network that allows essentially all of the current to be transferred to the next stage, including the currents through the shunt resistors, in a manner in which bandwidth is not lost.

Accordingly, it is a primary object of this invention to provide cascading of DC SQUID's on a single chip.

It is another object of this invention to provide an amplifier circuit comprised of DC SQUID stages, in which a minimum of off-chip circuit processing is required between the input to the amplifier and the output of the amplifier.

It is another object of this invention to provide an amplifier circuit comprising a plurality of stages of DC SQUID's, wherein the need for room temperature electronic circuits for signal processing is minimized.

It is another object of this invention to provide a fully integrated, low noise, broad bandwidth device comprised of a plurality of cascaded DC SQUID's.

It is another object of this invention to provide a DC SQUID amplifier having high gain and high bandwidth.

It is another object of this invention to provide a fully integrated, DC SQUID amplifier comprising a plurality of stages and feedback to improve input dynamic range and linearity.

It is another object of this invention to provide a technique for the effective transfer of current from one DC SQUID device to another DC SQUID device, where the transfer of current is accomplished over a very broad bandwidth.

It is a further object of this invention to provide a multiple junction DC SQUID having improved means for extracting power therefrom, wherein the extracted power has a wide bandwidth.

It is another object of this invention to provide at least two DC SQUID stages separated by a filter circuit having a real impedance over the frequency range desired, and wherein a bandwidth of approximately 1 GHz is obtained.

It is another object of this invention to provide a cascaded DC SQUID circuit where there is essentially complete transfer from one DC SQUID stage to the next, without detectable interactions between stages due to AC Josephson currents.

DISCLOSURE OF THE INVENTION

The SQUID cascade of this invention is comprised of at least two stages, where each stage includes a DC SQUID. A means is connected to the output of the first stage for delivering current to the input of the second stage, where essentially all of the current in the first stage is transferred to the input of the second stage.

The coupling network is comprised of a filter circuit having an essentially real impedance up to the frequencies of interest (that is, the frequency of oscillation of the Josephson junctions in the SQUIDS), where the real impedance of the filter is chosen to allow a high percentage of current to be transferred to the input of the second stage. This filter can be directly connected to the shunt resistors of the junctions in the DC SQUID, so that essentially all of the current which passes through the shunt resistors will also be delivered as an input to the second stage. In a preferred embodiment, negative feedback is used to improve the input dynamic range and linearity of the amplifier, although this slightly reduces the gain which can be provided. In a two-stage amplifier, the negative feedback loop is from the output of the second DC SQUID to the input of the first DC SQUID.

Thus, in its broadest sense, the invention is a fully integrated cascade circuit comprising two stages of DC SQUID's located on a single circuit chip, where a coupling means is connected to the shunt resistors of the first DC SQUID in order to extract power therefrom, and wherein the coupling means is connected to the input of the second SQUID. The DC SQUID's are comprised of superconducting loops including tunnel junctions, where the number of such junctions is arbitrary. A filter circuit is used as the coupling network, and provides a real impedance for the frequencies of interest, as well as providing a means for preventing the transfer of AC Josephson oscillations to the input of the second stage.

Each SQUID stage can be optimized for a specific purpose, such as input dynamic range, gain, noise suppression, etc.

These and other objects, features, and advantages will be apparent from the following more particular description of the preferred embodiments.

BRIEF DESCRIPTION OF THE DRAWINGS

FIG. 1.1 is a schematic illustration of a DC SQUID having an input coil adjacent thereto, while FIG. 1.2 is an electrical circuit representation of the device of FIG. 1.1, which shows the shunt resistors used to provide nonhysteretic junctions in the SQUID.

FIG. 2 is a current-voltage (I-V) plot for the SQUID of FIG. 1.1, showing a family of curves which are obtained for different inputs to the SQUID.

BEST MODE FOR CARRYING OUT THE INVENTION

Figure 3:
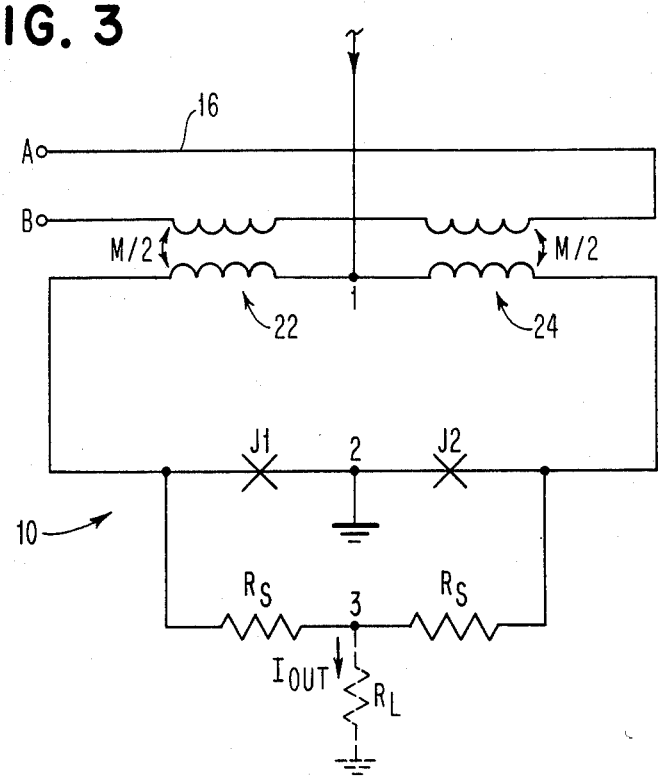
FIG. 3 is an electrical circuit diagram of a SQUID having shunt resistors and an output load $R_L$ to which it is desired to deliver a maximum of current while maintaining close coupling between this load and the two Josephson junctions of the SQUID.

DC SQUID Operation (FIGS. 1.1, 1.2, and 2)

A typical DC SQUID 10 is shown in FIG. 1.1, where the SQUID is comprised of a superconducting loop 12 and two Josephson junctions J1 and J2. A DC bias $I_{dc}$ is applied to the SQUID along superconductor 14. Josephson elements J1 and J2 are Josephson tunnel junctions which are represented by a resistively shunted junction model, as is well known in the art. Each junction has a critical current $I_0$ and is shunted by a linear resistance $R_s$ (FIG. 1.2) and a capacitance (not shown). Magnetic flux is coupled to the SQUID either by applying an external magnetic field, or by passing a current through an input coil 16 which is situated in close proximity to SQUID 10. The magnetic flux is coupled into the SQUID via the mutual inductance between the input coil 16 and the SQUID loop 12. A SQUID may be considered generically as an energy sensitive device, since it can react to electrical current or to magnetic field.

The maximum zero voltage current $I_m$ that can be passed through the SQUID in the absence of an applied magnetic flux is $2I_0$. If magnetic flux is applied to the SQUID in a linearly increasing fashion, $I_m$ will decrease, reach a minimum, and then return to its original value. Further increases in the applied flux will result in repeated oscillations in $I_m$, exhibiting a period of $\phi_0$, where $\phi_0$ is the flux quantum. If J1, J2 are identical, a symmetrical SQUID will be provided where the output V is taken across terminals 18 and 20.

FIG. 1.2 is an electrical representation of the device of FIG. 1.1, where Josephson junctions J1 and J2 are shunted by resistances $R_s$, in order to make them nonhysteretic when a magnetic flux is applied to the SQUID loop. The total inductance of the loop 12 is L, so each of the inductors 22 and 24 represent an inductance L/2. The inductance of input coil 16 is $L_i$, so each of the inductors shown in this coil has an inductance $L_i/2$.

FIG. 2 is a current-voltage characteristic of the SQUID of FIG. 1.1, showing a family of I-V curves for different values of applied flux. The top curve 26 applies when no flux is coupled to SQUID 10, while the second curve 28 applies when a flux of approximately $\phi_0/4$ has been coupled to SQUID 10. Bottom curve 30 is the I-V curve for an applied flux of approximately $\phi_0/2$.

For a bias current $I_{b1}$ equivalent to a flux $\phi_0/4$, a voltage swing $\Delta V_1$ will occur when magnetic flux having a magnitude between zero and $\phi_0/2$ is applied by current in input coil 16. If the SQUID is biased at a current $I_{b2}$ equal to the critical current of the SQUID, a greater voltage range $\Delta V_2$ will be achieved as the input flux varies. However, this increased voltage range may also have increased noise. Therefore, the designer chooses the bias for the SQUID in accordance with considerations such as gain, noise, magnitude of input signal, and the noise level of the input signal. In many applications it may be preferable to have a multistage amplifier comprising cascaded SQUID sections, where the first stage is designed for low noise, and succeeding stages are designed for enhancing dynamic range.

Cascaded SQUID's (FIGS. 3-7)

FIG. 3 represents a conventional 2-junction DC SQUID, except that a new arrangement of load resistors is provided. In contrast with the electrical circuit representation of FIG. 1.2, FIG. 3 shows a different arrangement of the load resistors and a different way for extracting the output of the SQUID 10. Note that the output from SQUID 10 in FIG. 1.2 is taken across terminals 1 and 2 while the output $I_{out}$ from SQUID 10 in FIG. 3 is the current through resistor $R_L$. In the practice of the present invention, it is important to provide a current output, rather than a voltage output, and to transfer to the succeeding stage essentially all of the current which flows through the shunt resistors $R_s$. If the output were taken across terminals 1 and 2, the multiple stage amplifier would not provide a proper SQUID output, and would not have the bandwidth and frequency response obtainable in the cascade of the present invention.

In order to explain the conclusion of the previous paragraph, the desired goal is to deliver a maximum of current to a single load $R_L$ while maintaining close coupling between the load and the two junctions J1 and J2. It would be unsuitable to place only a single load resistor from terminal 1 to terminal 2 because such a resistor would be isolated by the SQUID inductors 22 and 24 from the junctions J1 and J2. Additionally, it is well known that a reactive load is incompatable with good SQUID performance. If desired, a capacitor or resistor can be connected in parallel across inductors 22 and 24 to minimize the SQUID resonance frequency and amplitude.

Figure 4:
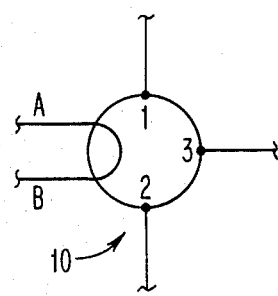
FIG. 4 is a symbolic representation for the DC SQUID of FIG. 3, without the load $R_L$.

FIG. 4 is a symbol used to represent the SQUID circuit of FIG. 3, where the terminals 1, 2 and 3 are as indicated. The load $R_L$ is not part of this symbolic representation, and is to be connected to terminal 3.

Figure 5:
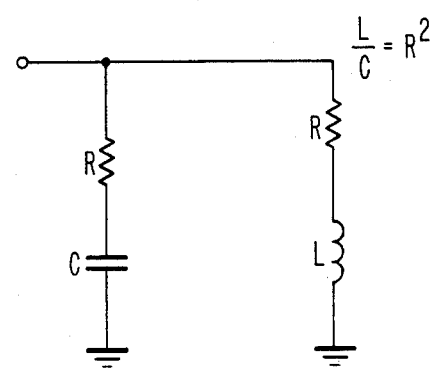
FIG. 5 is a circuit diagram of a coupling network which can be used in place of the load resistor $R_L$ in order to deliver a maximum amount of DC current from the SQUID shown in FIG. 3 to another DC SQUID stage.

Previously, it was stated that a reactive load is incompatible with good SQUID performance. In FIG. 5, a low pass filter is shown that is an important part of the interconnection between two SQUID stages. While other interconnection circuits can be used, this filter is particularly suitable for two reasons. First, it has a strictly real input impedance if $L/C = R^2$. This means that it can be used in place of $R_L$ in FIG. 3, without introducing reactance into the SQUID load. At the same time, this circuit provides good coupling of low frequency components of a SQUID output current to the next SQUID in the cascade. Still further, this filter prevents interactions between the SQUID's in the cascade, especially where SQUID's are integrated on the same superconducting chip. The use of this filter as a coupling network will provide a complete transfer of current from one SQUID stage to the next without undesirable interaction between SQUID stages due to AC Josephson currents. That is, the Josephson junctions J1 and J2 in the SQUID's have AC Josephson oscillations of approximately 20 GHz. These current oscillations pass through capacitor C to ground, and will not be transferred to the next SQUID stage. On the other hand, the lower frequency components, which must be transferred to the next SQUID stage in order to provide high gain, are transmitted through inductor L, and are thereby coupled to the next SQUID stage. For present Josephson circuit technology, L and C are numerically equal when R is 1 ohm.

Figure 6:
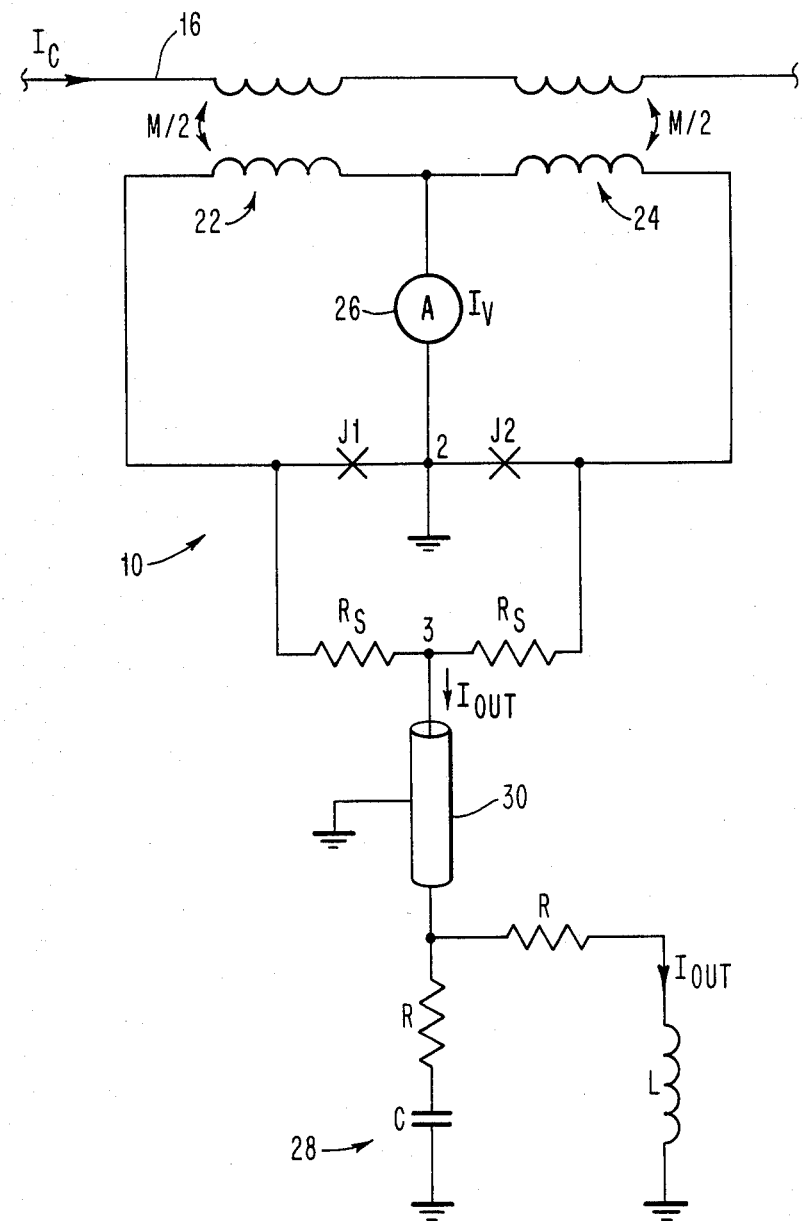
FIG. 6 is a circuit diagram illustrating the replacement of the load $R_L$ in FIG. 3 by the filter circuit of FIG. 5.

FIG. 6 is an electrical circuit representation of a SQUID stage 10 using, wherever possible, the reference symbols that were previously used. Bias to the SQUID 10 is provided by the current source 26, which is connected across terminals 1 and 2, the same as it would be in FIG. 3. Terminal 3 is connected to a load comprising the filter circuit 28 of FIG. 5, where the characteristic impedance of transmission line 30 is matched by filter 28. In one embodiment, the resistors R and $R_s = 1$ ohm.

Figure 7:
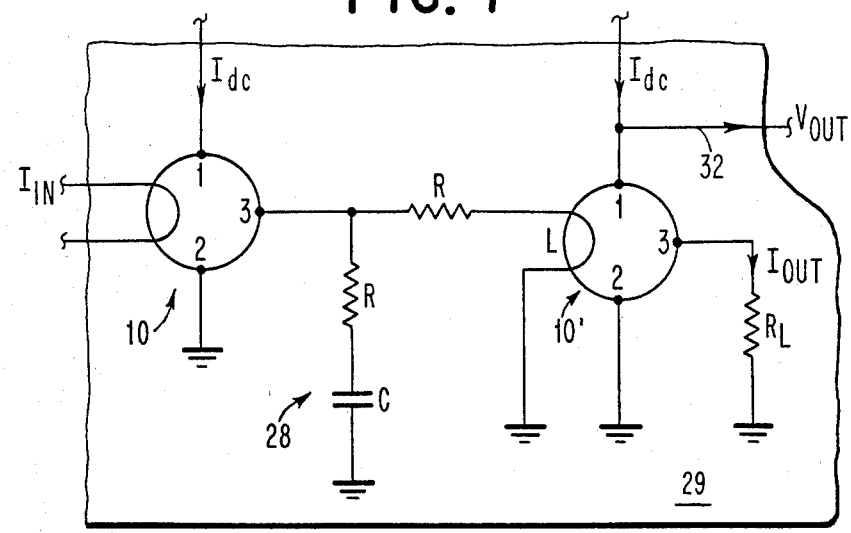
FIG. 7 is a circuit diagram illustrating an on-chip cascade of two DC SQUID stages, where the coupling circuit of FIG. 5 is used between the output of the first stage and the input to the second stage.

FIG. 7 shows a cascade of two SQUID stages 10, 10' coupled by the filter network and carried together on chip 29, which is shown partially in FIG. 7 28. The symbolic representation of FIG. 4 is used to represent the SQUID stages. The current input signal $I_{in}$ is applied to the first stage, and the current output from the first stage is taken from terminal 3 thereof and applied to the filter circuit 28, appearing as an input signal to the second SQUID stage. The current $I_{out}$ through $R_L$ is the output current from the amplifier. In a representative circuit, the resistors R can be 1 ohm, as noted previously, while C=400 pF and L=400 pH. The voltage output $V_{out}$ from the amplifier is taken from superconductor 32.

Figure 8:
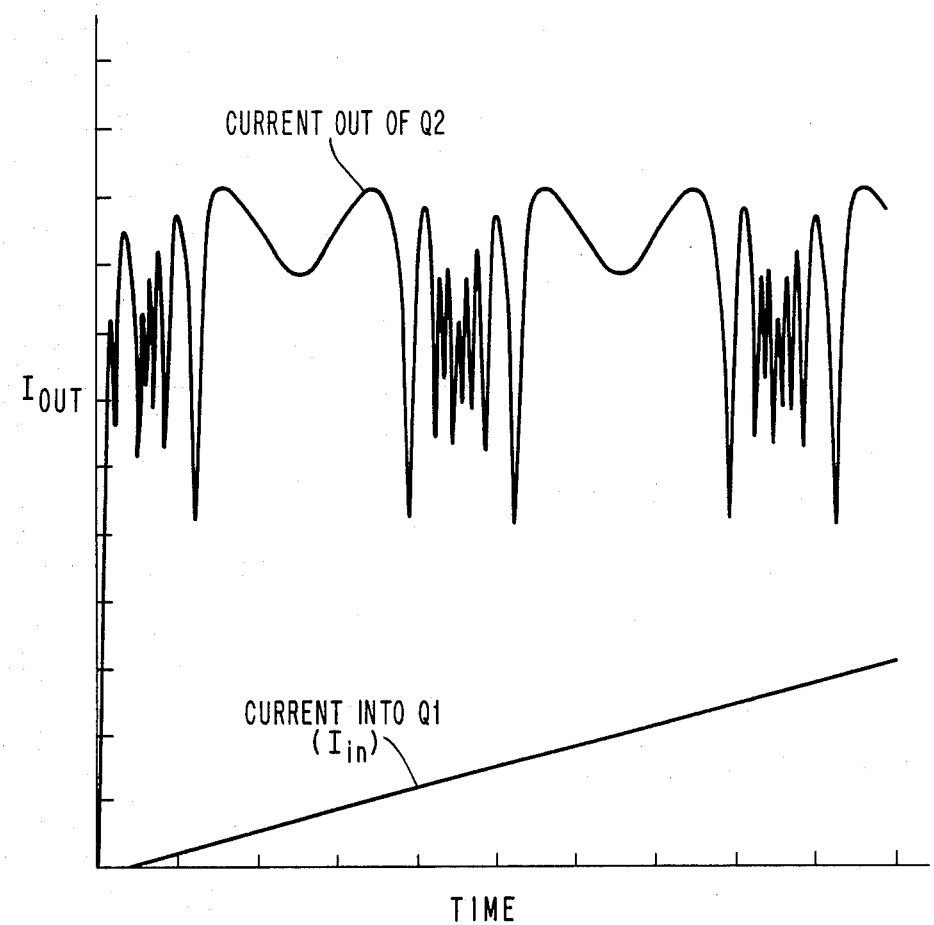
FIG. 8 shows the output characteristic of a two-SQUID cascade and illustrates the SQUID cascade transfer function.

FIG. 8 depicts the output characteristic of a two-SQUID cascade of the type shown in FIG. 7. This is a plot of the current $I_{out}$ from the second stage of the amplifier as a function of time, for a current $I_{in}$ which is a linearly increasing ramp. Normally, an operating point for the cascade would be chosen by adding a bias current to $I_{in}$, as was explained with respect to FIG. 2.

The bias current would be such that the operating point would be on one of the steep sections of the curve for $I_{out}$ shown in FIG. 8. The dynamic range of the output is limited to the voltage modulation depth of the output stage of the two-stage cascade. The dynamic range of the input is limited to approximately the output dynamic range divided by the slope (gain) at the operating point. FIG. 8 is a computer simulation of the operation of the two-SQUID cascade of FIG. 7, where the gain of the cascade is approximately 90.

Cascade with Feedback (FIGS. 9, 10, 11 and 12)

Figure 9:
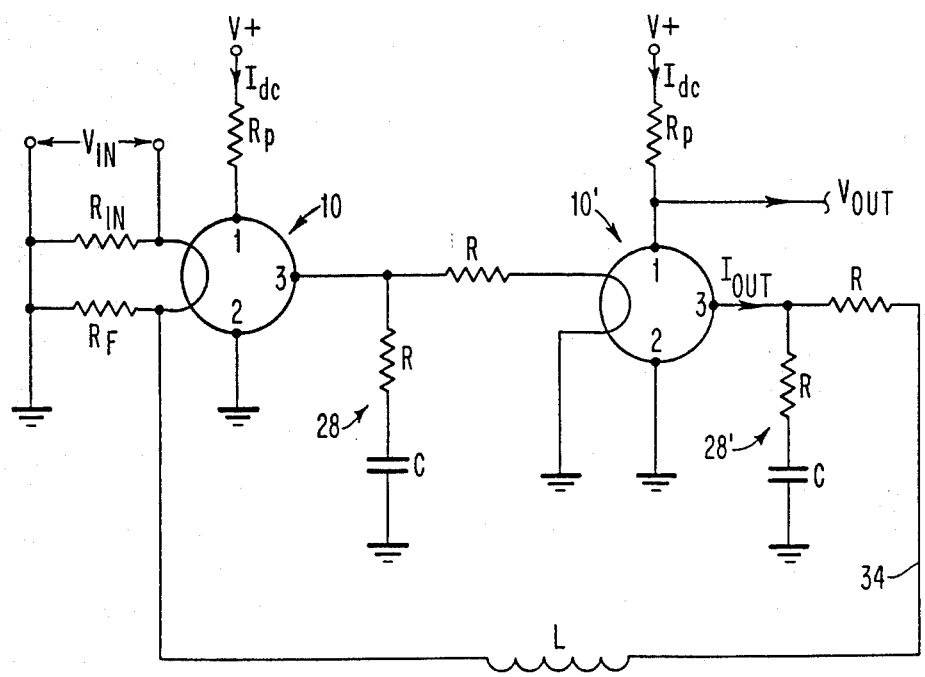
FIG. 9 shows the SQUID cascade of FIG. 7, incorporating a negative feedback loop to improve input dynamic range and linearity.

The input dynamic range and the linearity of the cascade amplifier can be improved at the expense of gain by incorporating negative feedback, as illustrated in the circuit diagram in FIG. 9. In this diagram, the symbolic representation of FIG. 4 is again used for the SQUID stages, and the same reference numerals are used wherever possible. Currents $I_{dc}$ are provided through power supply resistors $R_p$ to the SQUID stages 10, 10'. The output current $I_{out}$ of stage 10' of the amplifier is sent to a second filter circuit 28' comprising the resistors R, the capacitance C, and the inductor L which is located in the feedback loop 34. Resistors $R_{in}$ and $R_F$ are provided in the input to the first SQUID stage, and are used to adjust the operating points of the circuit, as will be more apparent when FIG. 10 is discussed.

For well known reasons involving the stability of feedback loops, it is desirable for the ratio of the two dominant time constants of the circuit of FIG. 9 to be equal to the loop gain. Consequently, a 100 psec. time constant associated with the input coils of the SQUID's 10, 10' and a loop gain of 100 would require a feedback network with a time constant L/R of the order of 10 nanoseconds. This requires a 10 nH inductor L and a 10 nF capacitor C in the filter 28'.

Figure 10:
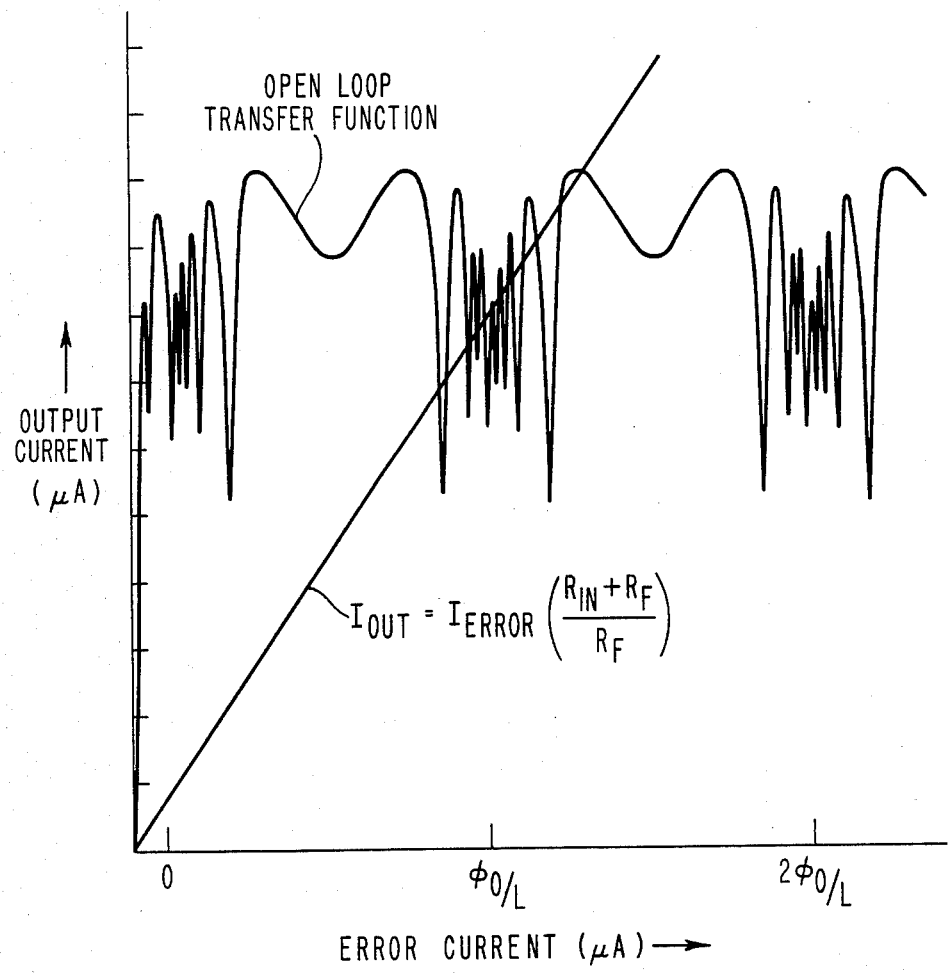
FIG. 10 is a plot of output current versus error current, where the error current is the current flowing in the coil input to the first SQUID stage.

FIG. 10 is a graphical solution of the operating points of the SQUID cascade of FIG. 9, where the output current is plotted against the "error current". The operating point of this circuit can be chosen without resorting to any ancillary bias. The error current represents the current flowing in the input coil to the first SQUID stage 10. The open loop characteristic (as in FIG. 8) is plotted against the error current. Also, the output current required to produce a given error current is plotted against error current, assuming zero input signal to SQUID 10, and taking into account the current split between $R_{in}$ and $R_f$ in the circuit of FIG. 9. Possible operating points exist wherever the straight line ($I_{out}$) and the open loop characteristic intersect. By changing the ratio of $R_f$ to $R_{in}$, the operating point (defined as the intersection of $I_{out}$ and the open loop transfer function) can be moved.

Figure 11:
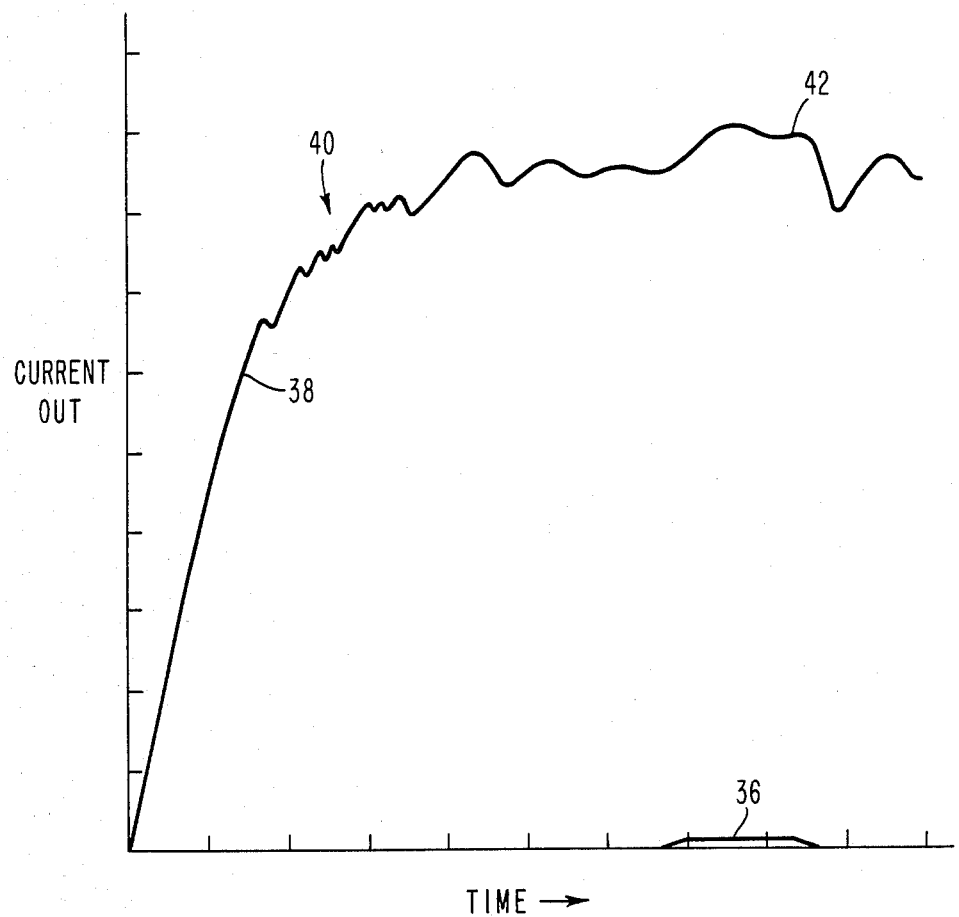
FIG. 11 is a simulation of a two stage SQUID amplifier in operation with a closed negative feedback loop, illustrating the pulse response of the amplifier.
Figure 12:
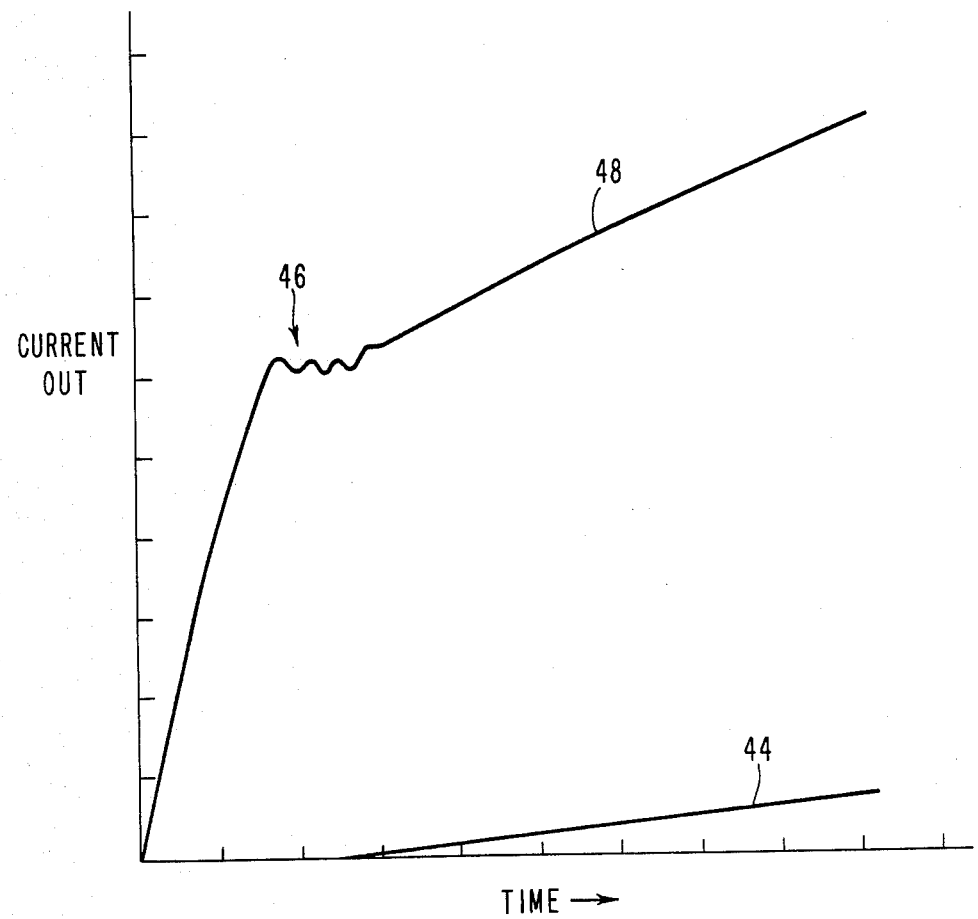
FIG. 12 is a simulation of the amplifier in operation with a closed negative feedback loop, illustrating the response of the amplifier to a linear ramp input.

FIGS. 11 and 12 are simulations of the amplifier in operation with the negative feedback loop closed. FIG. 11 shows the pulse response of the amplifier, plotting the current output which occurs in response to an input pulse 36 against time. Curve 38 shows the initial transients 40 occuring in the amplifier due to the onset of power. The pulse response 42 rests on a DC level determined by the bias to the amplifier.

FIG. 12 is the response of the amplifier to a linear ramp 44. Again, transients 46 occur before the linear output 48 is seen in the output current.

FIGS. 11 and 12 illustrate a fairly linear response over the dynamic range of the output stage, and a broadband frequency response of nearly 1 GHz. The gain in these simulations was between 4 and 5, which is close to the ratio of $R_{in}$ to $R_f$.

In the practice of this invention, a SQUID cascade has been described using a plurality of stages of DC SQUID's, where the stages are coupled in a manner to provide efficient current transfer between stages, in order to provide an amplifier having a bandwidth greater than that previously obtained in SQUID circits, for the same sensitivity. It will be appreciated by those of skill in the art that the principles described for coupling SQUID stages can be exemplified by circuits other than those shown herein, the principle of invention being that the current through the shunt resistors of the first SQUID stage can be delivered to the second SQUID stage by a coupling network whose impedance is real up to a high frequency, and whose impedance will match that of a coupling transmission line. This impedance is sufficiently small that essentially all of the current is transferred from the first SQUID stage to the second SQUID stage, but is large enough that the bandwidth of the amplifier is large.

Although an immediate application for this invention is in the area of far infrared detection, where the integrated amplifier is a part of a fully integrated millimeter wave receiver, it will be appreciated that other applications will be apparent.

While the invention has been described with respect to certain embodiments thereof, it will be appreciated by those of skill in the art that variations can be made which will be within the spirit and scope of this invention.

Having thus described our invention, what we claim as new and desire to secure by Letters Patent is:

1. A superconducting circuit having high sensitivity and bandwidth, comprising in combination:
   first and second DC SQUID stages located on the same superconducting chip, said first and second stages each including an input means, an output means, a superconducting loop having at least two Josephson devices therein and means for biasing each stage with a DC current, there being shunt resistors across said Josephson devices to render said devices nonhysteretic,
   coupling means located on said superconducting chip for interconnecting said first and second stages with a high efficiency over a large bandwidth, and for transferring current from said first stage to said second stage, said coupling means including,
   transmission line means connected to said shunt resistors of said first stage for receiving the current flowing in said shunt resistors,
   impedance means for matching the impedance of said transmission line for maximum transfer of current to said second stage, said impedance means providing a real impedance over a large frequency range and having a sufficiently large magnitude to insure large bandwidth, and
   means for substantially preventing high frequency Josephson oscillations in said first stage from reaching the input means to said second SQUID stage.

2. The circuit of claim 1, further including superconducting feedback means connecting the output means of the second SQUID stage to the input means of said first SQUID stage.

3. The circuit of claim 1, where said Josephson devices are comprised of Josephson tunnel junctions.

4. The circuit of claim 1, where said coupling means is comprised of a RLC filter network where the values of L and C are chosen to provide a substantially real impedance of said coupling network up to approximately the frequencies of oscillation of said Josephson devices.

5. The circuit of claim 1, where said coupling means is connected to a terminal electrically connecting said shunt resistors in said first stage.

6. A superconducting circuit, comprising in combination:
   a superconducting circuit chip including a DC SQUID thereon, said SQUID being a superconducting loop having at least two Josephson devices therein,
   means for supplying a D.C. bias current to said SQUID,
   input means for coupling a signal to said SQUID,
   output means for taking a current output from said SQUID,
   resistances connected in shunt to said Josephson devices in said SQUID for rendering said devices nonhysteretic as the critical current of said Josephson devices changes depending upon the signal in said input means,
   impedance means directly connected to said shunt resistors for receiving said output current therefrom, said impedance means being comprised of a circuit providing a real impedance at frequencies up to about the frequency of Josephson oscillation of said Josephson devices, said real impedance being sufficiently large to provide a large bandwidth of transmission from said DC SQUID.

7. The circuit of claim 6, where said impedance means is comprised of a circuit including reactive elements, the inductance and capacitance of said impedance means being chosen to provide impedance up to the frequency of said Josephson oscillations.

8. The circuit of claim 6, where said shunt resistances are connected across said Josephson devices in said superconducting loop and are electrically connected to one another at an output terminal of said SQUID, said impedance means being connected to said output terminal.

9. An integrated superconducting circuit comprising in combination:
   a first stage comprised of a DC SQUID, said SQUID including a superconducting loop having at least two Josephson devices therein and means for providing a DC current to said loop, there being input means for providing an input signal to said SQUID and an output terminal connected to said SQUID for delivering an output current from said SQUID,
   shunt resistors in parallel with said Josephson devices for making said Josephson devices nonhysteretic,
   an energy sensitive device located on said superconducting chip,
   coupling means connected to said output terminal of said DC SQUID for receiving said output current therefrom, said coupling means being connected to said energy sensitive device and including a transmission line connected to said shunt resistors where said coupling means includes filter means for providing a real impedance and for preventing the transmission of high frequency oscillations to said current or magnetic field sensitive device, said filter means having a real impedance matched to the impedance of said transmission line.

10. The circuit of claim 9, where said Josephson devices are tunnel junctions.

11. The circuit of claim 10, where said filter means is comprised of a RLC network having a substantially real impedance up to the frequencies of oscillation of said tunnel junctions.

12. The circuit of claim 11, where said energy sensitive device is a second DC biased SQUID.

13. The circuit of claim 12, where said second DC SQUID has an output which is fed back to the input of said first DC SQUID stage.

14. The circuit of claim 11, where said shunt resistances are included in a superconducting network in parallel with said Josephson devices, said transmission line being electrically connected to said network at a node between said two shunt resistors.

15. A superconducting circuit comprising in combination:
- a first DC SQUID stage including an input thereto and an output therefrom, a superconducting loop having at least two Josephson devices therein, shunt resistors connected in parallel with said Josephson devices for making the behavior of said Josephson devices nonhysteretic, means for applying a DC bias current to said superconducting loop, wherein said shunt resistors electrically form a superconducting loop with said Josephson devices, an output from said first stage being taken from an electrical node between said shunt resistors,
- a second DC SQUID stage comprising a superconducting loop having at least two Josephson devices therein, shunt resistors in parallel with said devices for making the behavior of said devices nonhysteretic, means for applying a DC current bias to said superconducting loop, an input to said second SQUID stage and an output therefrom,
- coupling means located between the output of said first DC SQUID stage and the input to said second DC SQUID stage for transferring current from said first SQUID stage to the input of said SQUID stage, wherein said coupling means is connected to the output of said first stage at an electrical node between said shunt resistors, said coupling means including a transmission line and an impedance matching circuit connected thereto whose impedance is substantially real up to the frequencies of Josephson oscillation of said Josephson devices,
- said coupling means receiving substantially all of the current through said shunt resistors and delivering said current to the input of said second DC SQUID stage, said coupling means including reactive means for preventing the transfer of high frequency Josephson oscillations from said first stage to said second stage, wherein the impedance of said coupling means is sufficiently high to insure a large bandwidth of said circuit.

16. The circuit of claim 15, including a feedback path from the output of said second stage to the input of said first stage.

17. The circuit of claim 15, where said Josephson devices are tunnel junctions.

* * * * *